Sept. 13, 1966 W. P. JONES ET AL 3,273,094

SUPERCONDUCTING MAGNET

Filed May 28, 1964 2 Sheets-Sheet 2

United States Patent Office 3,273,094

Patented Sept. 13, 1966

3,273,094
SUPERCONDUCTING MAGNET

William Pinkney Jones, Los Altos, and William A. Peterson, Palo Alto, Calif., assignors, by mesne assignments, to the United States of America as represented by the Administrator of the National Aeronautics and Space Administration Filed May 28, 1964, Ser. No. 370,989
5 Claims. (Cl. 335—216)

The present invention relates in general to magnet structures and more particularly to superconducting magnets operable within a vacuum and made of a plurality of turns of superconductive wire fed with electricity through a generally non-superconducting wire.

In the past, magnet coils made of superconducting wire have been utilized for generating magnetic fields at low temperatures such as on the order of around 4° K. One specific application for such a superconducting magnet is for providing the magnetic field in a traveling wave maser which, itself, requires a low operating temperature so that both the magnet and maser structures can be cooled by the same refrigeration arrangement. Due to the low thermal conductivity of superconducting wires in operational superconducting magnets, it has, in the past, been necessary to immerse the magnet in a cooling medium such as, for example, liquid helium. Naturally, such refrigeration systems are undesirable because of the problems in supplying and replenishing the refrigerant and cannot be utilized where such refrigerants are unavailable. Also, because of the necessity for contact between the refrigerant and the magnet coils, it has not been possible to enclose the magnet coils and refrigerant within one vacuum envelope. While it has been possible to conduction cool the interaction structure such as the traveling wave maser associated with the superconducting magnet, up to now it has been impossible to conduction cool the superconducting magnet.

Broadly stated, the present invention is directed to a superconducting magnet including a plurality of turns of superconducting wire for operation in an environment below the critical temperature of the superconducting wire and preferably in a vacuum with the superconducting wire covered with a layer of high electrically and thermally conductive metal such as, for example, copper and a layer of electrically non-conductive material covering the layer of copper and electrically insulating adjacent turns of the magnet from one another.

One of the principal advantages of the present invention over prior art structures lies in the fact that the copper coating on the superconducting wire serves as a thermal conductor at all temperatures and especially below the critical temperature of the superconducting wire to allow the entire magnet coil to be cooled by conduction and maintained at a temperature below the critical or superconducting temperature. This permits the superconducting magnet and other associated refrigerated assemblies to be mounted from the same conduction cooled mounting flange.

An additional feature of this construction lies in the fact that the copper coating on the superconducting wire permits the flow of current through the copper layer at room temperature for testing the magnet. Thus when current is applied to the magnet at room temperature, it is carried principally in the copper layer to produce a magnetic field which simulates that produced by the superconducting wire at temperatures below the critical temperature for the purpose of making tests of the uniformity of the magnet field. This construction permits the majority of field measurements on a superconducting magnet constructed in this manner to be performed without the time consuming and cost incurring process of cooling the magnet below critical temperature.

Still further, this construction permits the utilization of the superconducting magnet inside a vacuum, and in such case the magnet can be conduction cooled by means of a closed cycle refrigerator conveniently located within the vacuum envelope for high efficiency. Additionally, other associated equipment such as a traveling wave maser, the requisite magnet field for which is provided by the magnet, can be mounted within the same vacuum envelope and thereby best protected from the effects of the surroundings.

As another feature of the present invention, a superconducting magnet coil constructed in accordance with the present invention is provided with thermal conducting straps such as of copper connecting the coil forms to the conduction cooling flange for fast efficient cooling of the superconducting magnet wire.

As still a further feature of the present invention, the superconducting magnet is supported in a housing isolated from ambient temperatures via a plurality of refrigerated intermediate members, each of the intermediate members being conduction or otherwise cooled to graduated temperatures intermediate ambient temperature and the critical temperature of the superconducting magnet. The lead-in wire for the magnet which necessarily must be of non-superconductive material, is passed through and refrigerated at each of the intermediate members by means of thermal conductive electrically insulating mounting members.

Other objects of the present invention will become apparent upon reading the following specification and referring to the accompanying drawings in which similar characters of reference represent corresponding parts in each of the several views.

While the present invention will, for convenience, be described below with respect to a superconducting magnet and, particularly, such a magnet used in combination with a traveling wave maser, the superconducting material construction can be utilized in many other structures such as, for example, those in which superconducting wire is employed and must be cooled for effective operation.

Figure 1:
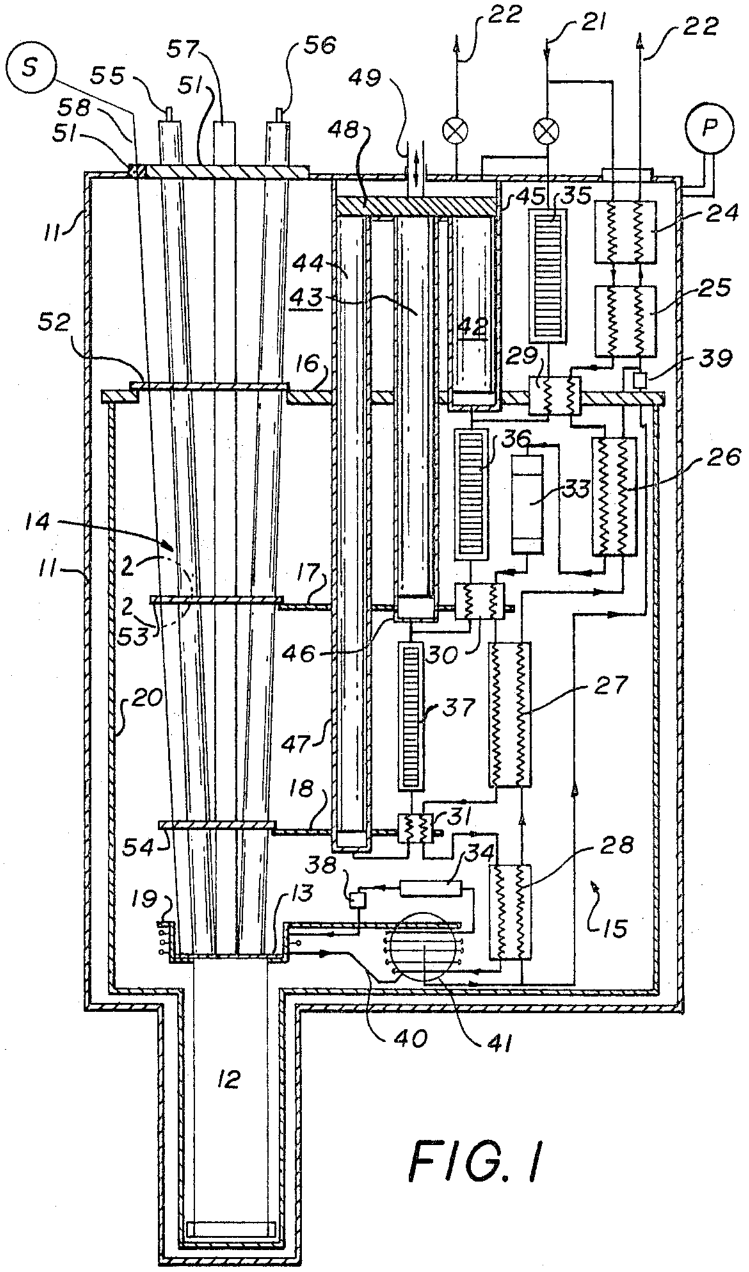
FIG. 1 is a schematic elevational view, partially broken away, illustrating features of the present invention.

Referring now to FIG. 1 of the drawing, there is shown a vacuum envelope 11 of, for example, stainless steel, in which is housed a casing 12 for a maser and its associated magnet mounted on a conduction cooling mounting flange 13 of, for example, copper, an intermediate temperature support structure generally indicated as 14 for supporting and thermally isolating the casing 12 within the envelope 11 and a closed cycle refrigeration system generally indicated as 15 for cooling the mounting flange 13 and the various stages of the intermediate support structure 14.

The closed cycle refrigeration system 15 includes first, second and third intermediate temperature stage conducting members 16, 17 and 18 respectively of, for example, copper, which are maintained at progressively lower temperatures such as, for example 80° K., 35° K. and 15° K. from the vacuum envelope 11 which is at ambient or room temperature such as 300° K. The lowest temperature stage of the closed cycle refrigeration system 15 provides conduction cooling liquid to a main conduction cooling member 19 of, for example, copper, for maintaining the member 19 and the conduction cooling mounting flange 13 in contact therewith at the maser operating temperature such as, for example, on the order of 4.2° K. A polished radiation shield 20 of, for example, copper, is mounted on the first intermediate conducting member 16 and surrounds the second and third stage members and the casing 12 for preventing heat radiation to the cooler portions of the refrigerated assembly.

The closed cycle refrigeration system 15 of a type generally well known in the art includes the combination of a Joule-Thomson expansion unit and a heat engine. Since the refrigeration system does not itself form a part of the present invention, the system will not be described in detail other than to point out that, as illustrated in the drawings, it includes gas inlet and exhaust lines 21 and 22 respectively, heat exchangers 24–31, filters 33 and 34, regenerators 35–37 and expansion valves 38 and 39. Refrigeration liquid is conveyed in a line 40 from the expansion valve 38 to the main conduction cooling member 19 and back to a liquid reservoir 41.

The refrigeration system also includes displacers 42–44 of an insulating material such as, for example, phenolic, which are housed in a substantially non-thermal conductive housing such as of stainless steel which is formed to provide cylinders 45–47 for the displacer pistons 42–44 respectively. The displacers 42–44 are mounted on a header 48 which is driven by means of a shaft 49 from a reciprocator (not shown).

The intermediate temperature support structure 14 includes a cover flange 51 which is sealed into an opening in the housing 11 in a vacuum-tight manner and is fixedly secured, also in a vacuum-tight manner, to the electrical connections to the maser which include an RF input coaxial line 55 for carrying the signal to be amplified to the maser, an RF output coaxial line 56 for carrying the amplified signal from the maser, and a pump frequency waveguide 57 for directing the pump signal from the source (not shown) to the maser interaction structure. A coil lead wire 58 such as, for example, copper wire, provides current to the magnet coils described in greater detail below. Intermediate the cover flange 51 and the conduction cooling member 13, the conductors 55–58 are fixedly secured to intermediate mounting members 52, 53 and 54 of, for example, copper, which, when the maser is inserted into the vacuum envelope 11, respectively contact the first, second and third stage conducting members 16, 17 and 18 of the refrigeration assembly for progressively reducing the temperature of the conductors 55–58 from the flange 51 which is maintained at ambient or room temperature to the conduction cooling mounting flange 13 which is maintained at a temperature near absolute zero. The conductors 55–57 which are conventionally of low conductivity metal such as, for example, stainless steel, in order not to conduct a large amount of heat into the envelope, are fixedly secured to flanges 52–53 in a conventional manner such as, for example, by brazing. The lead-in wire 58 is connected to these flanges in a conduction cooling manner as described in detail with reference to FIG. 2. The envelope 11 is evacuated by means of a vacuum pump designated P. Naturally, the input and output signals can be coupled to the maser via waveguides instead of coaxial lines 55 and 56.

Figure 2:
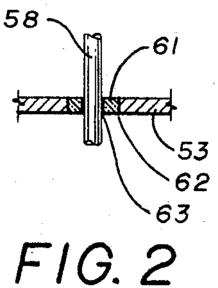
FIG. 2 is an enlarged sectional view of the portion of the structure shown in FIG. 1 delineated by line 2—2.

Referring now to FIG. 2, there is shown one of the intermediate mounting members 53 which is provided with a bore therethrough into which is inserted a hollow, cylindrical electrically insulating thermal conductive member 61 of, for example, beryllium oxide. The exterior surface of this cylinder is metalized as shown at 62 and bonded to the flange 53, while the interior surface is metalized as shown at 63 and bonded to the lead-in wire 58 for providing good thermal conduction from the wire 58 through the electrical insulator 61 to the flange 53 for cooling the wire 58. Since the ends of the cylindrical insulator 61 are not metalized, the wire 58 is electrically insulated from the mounting flange 53.

Whereas insulator 61 is preferably made of beryllium oxide because of its thermal conductivity, this element could also be made of alumina ceramic or similar insulators. Additionally, whereas the insulator is preferably a hollow cylinder which is bonded in an aperture through the flange 53, it could consist of a flat member bonded on its one side to a surface of the flange 53 and on its other side to the wire 58.

Figures 3, 4:
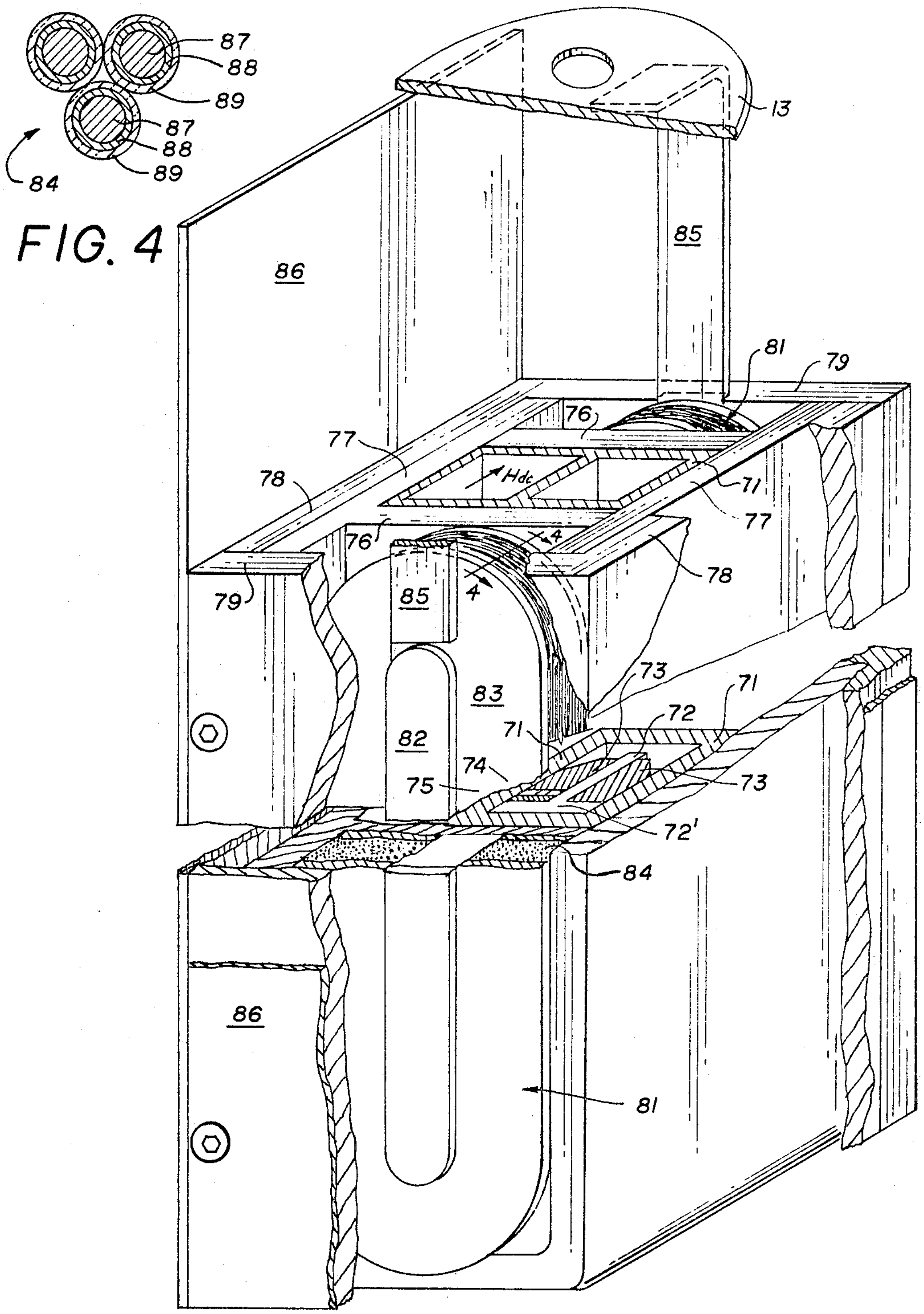
FIG. 3 is an enlarged perspective view, partially broken away, illustrating the construction of the magnet and maser assembly illustrated in FIG. 1.
FIG. 4 is an enlarged cross-sectional view of a portion of the structure shown in FIG. 3 taken along line 4—4 in the direction of the arrows.

Referring now to FIG. 3, there is shown a perspective view, partially broken away, of the casing 12 housing the superconducting magnet and the traveling wave maser structure. As shown, the maser includes a plurality of waveguides 71, one of which is illustrated in detail showing the maser elements contained therein. The maser elements include a coplanar array of equally spaced apart conducting fingers 72 running lengthwise of the waveguide 71 and projecting from a metal base member 72' located at one side of the waveguide 71. Provided on opposite sides of the array of fingers 72 are elements 73 of active or negative temperature material, such as various paramagnetic salts as, for example, aluminum oxide which has an impurity content of approximately one-thirtieth of one percent of trivalent-chromium referred to as "ruby" material. One of these elements is isolated from the base block 72' by an isolator of, for example, alumina ceramic, with periodically spaced apart discs 75 of gyromagnetic material such as, for example, yttrium-iron-garnet therebetween.

The active and gyromagnetic materials are magnetically biased by means of a common uniform magnetic field $H_{dc}$ (indicated by the arrow) directed parallel to the fingers 72 by means of the superconducting magnet described in greater detail below. In the presence of this field and when the structure is cooled to an operating temperature on the order of 4° K., the input signal directed into the waveguide 71 via the coaxial line 55 in the presence of the pumping signal directed into the waveguide 71 via the waveguide 57 is amplified as it travels along the waveguide 71, and the amplified output signal is conveyed out of the maser structure via the coaxial line 56.

Located within the casing 12 on the sides of the waveguide 71 toward which the fingers 72 point, are pole pieces 76 of, for example, magnetic iron, and the pole pieces 76 are confined between two field confining faces 77 of, for example, lead bismuth, which are, in turn, enclosed within magnetic side walls 78 of magnetic material. The side walls are closed by end walls of, for example, magnetic iron, which define a space extending to the pole piece 76 in between the field confining faces 77 for the magnetic coils 81.

These magnetic coils 81 include core members 82 of, for example, magnetic iron, which extend to the pole pieces 76 and which are provided with coil forms 83 of, for example, copper between which turns of wire 84 are wound for establishing the magnetic field $H_{dc}$. High thermal conducting metal straps 85 of, for example, copper, extend from the magnet coil forms 82 up to the mounting flange 13 for conduction cooling the magnet assembly and particularly the turns of wire 84. Polished reflector sheets 86 of, for example, copper, surround the magnet side and end walls 78 and 79 and extend up to the mounting flange 13.

Referring now to FIG. 4, the turns 84 of the superconducting magnet include a core wire 87 of superconducting material such as, for example, niobium zirconium wire or any other superconducting metal such as niobium tin which can be plated as described below. The wire 87 is surrounded by a layer or coating 88 of high electrically and thermally conductive metal such as, for example, copper, or silver or gold plated thereon and this layer 88 is covered with a layer or coating 89 of electrically non-conductive material such as epoxy, nylon, or other commercially available insulating material such as sold under the trademark Formvar. Naturally, any other insulator can be used but a material with as high a thermal conductivity as possible is preferred.

The superconducting wire coated in the manner described has a number of advantages. For example, the high electrical and thermally conductive metal layer 88 provides a conduction path to the superconducting core wire 87 for cooling the superconducting wire 87 and maintaining the superconducting wire at a temperature below its critical temperature in order to produce as high a magnetic field $H_{dc}$ as possible. Additionally, the layer 88 serves as a good electrical conductor at tempertures above the critical temperature of the superconducting core 87 so that the layer 88 can be used as the electrical path for testing the characteristics of the superconducting magnet at room temperature, thereby avoiding the necessity of cooling the magnet structure to the operating temperature of the superconducting core 87. The insulating layer 89 prevents shorting of the turns of the superconducting magnet.

By the use of the superconducting magnet with wire constructed in the manner described above, it has been discovered that it is possible to conduction cool a superconducting magnet and maintain the magnet at a temperature below the critical temperature of the superconducting material by this conduction cooling so that, for the first time, it has been possible to place a superconducting magnet inside a vacuum envelope with the attendant advantages characteristic of the use of a vacuum chamber.

By way of example, a superconducting magnet constructed in accordance with the present invention utilizing 600 turns of approximately 3 mil diameter niobium zirconium wire plated with copper coating approximately 1 mil thick in turn covered with a Formvar coating approximately 1 mil thick has produced at room temperature a D.C. magnetic field of approximately 30 gauss with 50 milliamperes current and has produced, when conduction cooled to a temperature on the order of 4.2° K., a D.C. magnetic field on the order of 400 gauss with 2.5 amperes in both the normal and the "persistent" modes.

Since the lead-in wire 58 is conduction cooled at the intermediate temperature flanges 52–54 before it reaches the flange 13 at which or adjacent which it is joined to the superconducting wire, no heat is added to the superconducting wire of the magnet by the lead-in wire 58 as would deleteriously effect operation of the superconducting wire.

While the present invention has been described above with respect to a superconducting magnet which is especially applicable for use in a conduction cooled assembly within a vacuum envelope, this structure can also be used to advantage in any other type of arrangement such as, for example, in a liquid helium bath as is conventional with normal superconducting magnets.

Although the foregoing invention has been described in some detail by way of illustration and example for purposes of clarity of understanding, it is understood that certain changes and modifications may be practiced within the spirit of the invention as limited only by the scope of the appended claims.

It is claimed:

1. A magnet assembly including: a vacuum envelope; a mounting flange supported within said envelope; means for cooling said flange; and magnet coils mounted from said flange, said coils including a plurality of turns of superconducting wire establishing a magnetic field within said vacuum envelope when cooled to a temperature below the critical temperature of said wire and conducting electrical current, said wire covered with a layer of electrically and thermally conductive metal operative to conduction cool said superconducting wire and to simulate the magnetic properties of said magnet when current is passed through said metal at temperatures above said critical temperature and a layer of electrically, substantially non-conductive material covering said layer of conductive metal and electrically insulating adjacent turns of said magnet.

2. The magnet assembly according to claim 1 characterized further in that said magnet includes coil forms for containing the superconducting wire and a thermally conductive metal strap connecting said coil forms to said mounting flange.

3. A superconducting magnet assembly comprising: a plurality of turns of superconducting wire for operation in an environment below the critical temperature of said superconducting wire; a mounting flange; means for supporting said turns of superconducting wire from said flange; means for cooling said mounting flange to a temperature below the critical temperature of said wire thereby to cool said wire to said temperature; means for supporting said mounting flange; means connecting a plurality of intermediate temperature mounting members to said mounting flange; means for cooling said members to temperature levels intermediate said critical temperature and ambient temperature; an electrical lead wire connected at one end to said superconducting wire and at the other end to a source of electrical energy; and a plurality of thermal conductive insulating members, one of said insulating members mounted on each of said intermediate temperature mounting members, said lead wire fixedly secured to each of said insulating members for cooling said lead-in wire at said mounting members.

4. The magnet assembly of claim 3 characterized further in that each of said mounting members is provided with a hollow cylindrical bore therethrough, each of said thermal conductive insulating members is secured at its exterior surface to one of said mounting members in the bore therethrough and secured at its interior surface to said lead wire.

5. A superconducting magnet assembly comprising: a vacuum envelope; a mounting flange; means for supporting said flange within said envelope; means connecting a plurality of intermediate temperature members to said mounting flange; a plurality of turns of superconducting wire for operation in an environment below the critical temperature of said superconducting wire, said wire covered with a layer of electrically and thermally conductive metal operative to conduction cool said superconducting wire to temperatures below said critical temperature and simulate the magnet properties of said magnet when current is passed through said metal at temperatures above said critical temperature and a layer of electrically non-conductive material covering said layer of conductive metal and electrically insulating adjacent turns of said magnet; an electrical lead wire connected at one end to said superconducting wire and at the other end to a source of electrical energy; a plurality of thermal conductive insulating members, each of said insulating members secured to said lead wire and to one of said intermediate members; mean for cooling said mounting flange to a temperature below the critical temperature of said wire; and means for cooling said intermediate members to temperature levels intermediate said critical temperature and ambient temperature.

References Cited by the Examiner

UNITED STATES PATENTS

| | | |
|---|---|---|
| 3,129,359 | 4/1964 | Kunzler. |
| 3,133,144 | 5/1964 | Cottingham et al. |
| 3,187,235 | 6/1965 | Berlincourt et al. |

BERNARD A. GILHEANY, *Primary Examiner.*

G. HARRIS, Jr., *Assistant Examiner.*